United States Patent
Yang et al.

(10) Patent No.: US 12,262,478 B2
(45) Date of Patent: Mar. 25, 2025

(54) SELECTIVELY APPLIED PROTECTIVE LAYER ON EXPOSED MATERIALS OF ELECTRONIC CIRCUIT BOARD AND ELECTRONIC COMPONENTS DISPOSED THEREON FOR IMMERSION BATH COOLED SYSTEMS

(71) Applicant: Intel Corporation, Santa Clara, CA (US)

(72) Inventors: Jin Yang, Hillsboro, OR (US); David Shia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 561 days.

(21) Appl. No.: 17/473,915

(22) Filed: Sep. 13, 2021

(65) Prior Publication Data
US 2021/0410292 A1 Dec. 30, 2021

(51) Int. Cl.
*H05K 3/28* (2006.01)
*H05K 7/20* (2006.01)

(52) U.S. Cl.
CPC ......... *H05K 3/282* (2013.01); *H05K 7/20236* (2013.01); *H05K 2203/0776* (2013.01)

(58) Field of Classification Search
CPC .. H05K 7/1432; H05K 7/203; H05K 7/20218; H05K 7/20236; H05K 7/20254; H05K 7/20263; H05K 7/20272; H05K 7/2029; H05K 7/20318; H05K 7/20327; H05K 7/20336; H05K 7/20381; H05K 7/20409; H05K 7/20418; H05K 7/20445; H05K 7/20663; H05K 7/208; H05K 7/20827; H05K 7/20872; H05K 7/20881;
(Continued)

(56) References Cited

U.S. PATENT DOCUMENTS

2021/0102294 A1\* 4/2021 Miljkovic .............. C23C 16/56
2021/0320050 A1 10/2021 Robinson et al.
(Continued)

FOREIGN PATENT DOCUMENTS

GB 2576032 B 4/2021
GB 2576030 B 12/2021
(Continued)

OTHER PUBLICATIONS

"3M™ Novec™ 7100 Engineered Fluid", 3M, Issued Sep. 2009, 4 pages.
(Continued)

*Primary Examiner* — Amir A Jalali
(74) *Attorney, Agent, or Firm* — Hanley, Flight & Zimmerman, LLC

(57) ABSTRACT

An apparatus is described. The electronic circuit board having electronic components thereon. A protective material coated on an exposed material of the electronic circuit board and the electronic components. The protective material being chemically inert with the exposed material. The protective material being chemically inert with an immersion bath cooling liquid that the electronic circuit board and the electronic components are to be immersed within. A thermal cooling structure of one of the electronic components that is designed to transfer heat into the immersion bath cooling liquid is not coated with the protective material.

18 Claims, 6 Drawing Sheets

(58) Field of Classification Search
CPC .. H05K 7/20927; H05K 7/2089; H05K 7/209; H05K 7/20909; H05K 7/20936; H05K 1/0203–0204; H05K 3/382; H05K 2203/0776; H01L 23/04; H01L 23/34; H01L 23/3675; H01L 23/3733; H01L 23/40; H01L 23/4006; H01L 23/4031; H01L 23/405; H01L 23/4056; H01L 23/4087; H01L 23/427; H01L 23/44; H01L 23/472; H01L 23/492

See application file for complete search history.

(56) References Cited

U.S. PATENT DOCUMENTS

| | | | | |
|---|---|---|---|---|
| 2021/0410292 | A1* | 12/2021 | Yang | H05K 7/203 |
| 2022/0406683 | A1* | 12/2022 | Im | H05K 7/20236 |
| 2023/0019930 | A1* | 1/2023 | Yoo | H05K 7/20236 |
| 2023/0071418 | A1* | 3/2023 | Hung | H01L 23/29 |
| 2023/0075909 | A1* | 3/2023 | Hung | H01L 23/4006 |

FOREIGN PATENT DOCUMENTS

| | | |
|---|---|---|
| GB | 2597525 A | 2/2022 |
| GB | 2601357 A | 6/2022 |

OTHER PUBLICATIONS

Henry Coles, et al., "Immersion Cooling of Electronics in DoD Installations", Lawrence Berkeley National Laboratory, DoD final report, May 2016, 111 pages.

James H. Aubert, et al., "Compatibility of Fluorinert FC-72 with Selected Materials", Sandia National Laboratories, Feb. 2006, 24 pages.

* cited by examiner

SELECTIVELY APPLIED PROTECTIVE LAYER ON EXPOSED MATERIALS OF ELECTRONIC CIRCUIT BOARD AND ELECTRONIC COMPONENTS DISPOSED THEREON FOR IMMERSION BATH COOLED SYSTEMS

BACKGROUND

System design engineers face challenges, especially with respect to high performance data center computing, as both computers and networks continue to pack higher and higher levels of performance into smaller and smaller packages. Creative packaging and cooling systems are therefore being designed to keep pace with the thermal requirements of such aggressively designed systems.

FIGURES

A better understanding of the present invention can be obtained from the following detailed description in conjunction with the following drawings, in which.

DETAILED DESCRIPTION

Figure 1:
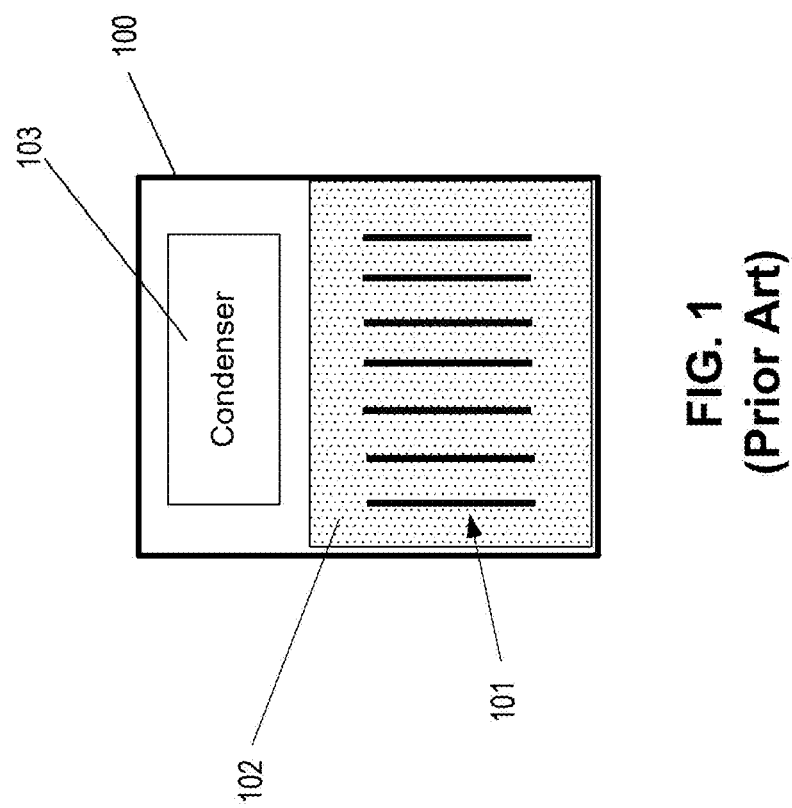
FIG. 1 (prior art) shows an immersion cooling system.

FIG. 1 depicts an electronic system such as a data center chassis/board with many attached active components being cooled in an immersion cooling system 100. As observed in FIG. 1, one or more electronic circuit boards 101 with mounted electrical components (e.g., semiconductor chips) are powered on and operating while the boards 101 and their components are immersed in a bath of thermally conducting but electrically insulating liquid 102. The complete immersion of the boards 101 and their components maximizes the surface area of the electrical system over which heat from the operating semiconductor chips can be released into the cooling medium (coolant 102). Additionally, as compared to air cooled systems, a liquid generally has a much higher latent heat and specific heat than air, which translates into a much lower thermal resistance for the cooling of the electronic circuit boards 101.

Here, heat from the operating semiconductor chips is transferred from the electronic circuit boards 101 to the immersion bath 102. According to a first thermal transfer mechanism, the temperature of the immersion bath 102 warms in response to the heat from the electronic circuit boards 101 but does not boil (the temperature of the immersion bath 102 remains below the liquid's boiling point). According to a second thermal transfer mechanism, which, e.g., can be applicable if the electronic circuit boards 101 are continuously operating above a certain power, the liquid in the immersion bath 102 boils and converts from a liquid to a vapor (the surface temperate of the electronic components on the boards 101 exceeds the liquid's boiling point). The vapor from the bath 102 will be condensed through a condenser 103 and returned to the bath 102 in liquid phase which effectively removes heat from the packaged electronic devices and the overall electrical system.

Figure 2:
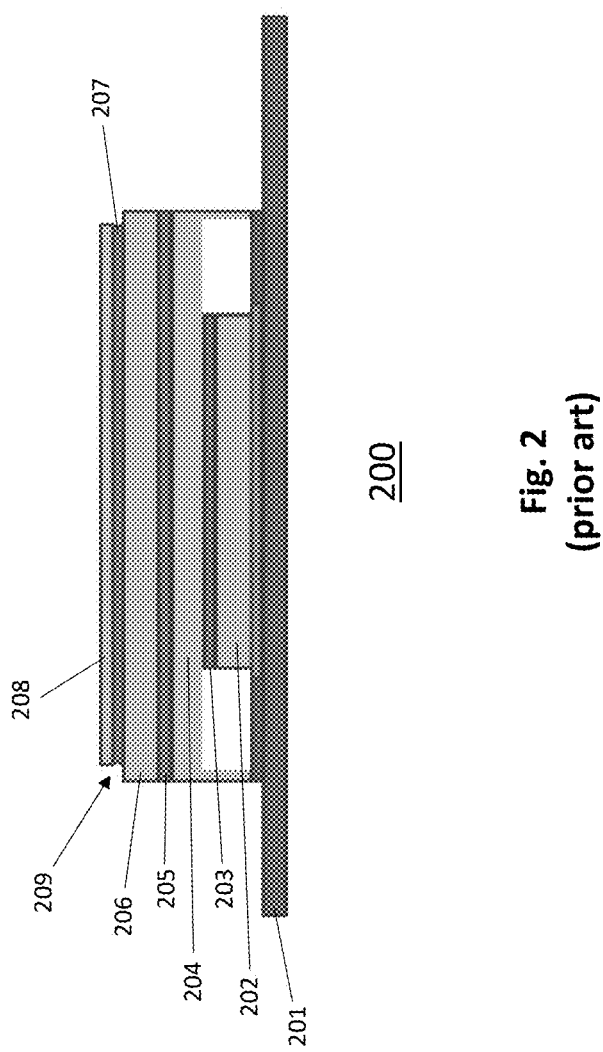
FIG. 2 (prior art) shows a packaged semiconductor chip and its immersion cooling assembly.

FIG. 2 shows a prior art structure 200 for transferring heat from a packaged semiconductor chip 202 to an immersion bath. Here, micro-electrical connections of the semiconductor chip 202 are mounted to a package substrate which, in turn, is mounted to an electronic circuit board 201. The back side of the silicon chip 202 is attached to a first thermal interface material (TIM) 203 and placed in contact with the underside of the lid 204 of the chip's package (also referred to as an integrated heat spreader (IHS)). The topside of the lid 204 is then attached to a second TIM 205. A thermally conductive solid mass 206 (e.g., a solid block of copper) is placed on the second TIM 205. A thermally conductive roughened and/or porous surface 208 (e.g., a stack of copper wire mesh) is attached to the mass 206 via low temperature solder, a fused low temperature adhesive bond or other bond 207 (for ease of discussion, the term "roughened" hereafter means "roughened and/or porous").

The aforementioned multi-layer structure is designed to transfer heat from the semiconductor chip to the roughened surface 208 with as little thermal resistance as is practicable (i.e., a high thermal efficiency is meant to exist between the semiconductor chip 202 and the roughened surface 208). The roughened surface 208 helps nucleate bubbles in the bath so that the liquid cooling system transfers the heat from the chip 202 to the bath when the power of the device is above a certain level as described just above (in general, irregular (non planar) surface structures help nucleate bubbles).

Referring back to FIG. 1, an issue is the possible chemical interaction between the immersion bath liquid 102 and the components on the electrical circuit boards 101 and/or the electronic circuit boards 101 themselves. Here, the components/boards are formed from a myriad of different materials, a number of which are exposed on the outer surface of the components/boards. Any one of these materials has the potential to chemically interact with the immersion bath coolant 102 resulting in degradation of the material (which leads to degradation of the component/board) and/or degradation of the coolant).

Simply stated, although the immersion bath coolant 102 is an electrical dielectric (which maintains electrical isolation between electrical components that are immersed in the bath), it is not necessarily inert against all materials. Because the outer surfaces of the electrical components and/or boards are composed of a myriad of different materials, it becomes very difficult to ensure that the bath 102 will not chemically react with any exposed materials of the components and boards. In particular, solders (e.g., solders composed of tin and bismuth (e.g., SnBi)), such as a solder 207 used to attached the roughened surface 208 to the solid mass 206, and/or solders used on DIMMs that are plugged into the electronic circuit board, are believed to possess some propensity to chemically react with the immersion bath liquid, resulting in electronic component failure, or contamination to immersion coolant, or contamination to other components on the PCB.

A solution is to selectively coat exposed materials of the electrical components and boards that chemically react with the liquid coolant with a material that is itself largely inert (e.g., an acrylic). By coating the exposed component/board materials that react with the liquid coolant with the inert material, the materials are prevented from chemically reacting with the immersion bath. Essentially, the inert material acts as protective barrier between the reactive, exposed component/board materials and the immersion coolant thereby preventing any chemical reaction between them.

Importantly, many of the materials that are used in the cooling assemblies for high performance semiconductor chips do not chemically react with the liquid coolant and therefore do not need to be coated with the inert material. For example, referring back to FIG. 2, the package IHS 204 (e.g., various metals), the TIM 205 (e.g., Indium), the solid mass 206 (e.g., copper) and the roughened surface 208 (e.g., copper) are all composed of materials that do not appreciably react with the liquid coolant (In various embodiments, the liquid coolant (examples of which are listed further below) does not contain water ($H_2O$), or oxygen generally, which can chemically react with copper or other metals, e.g., gold, nickel, or other materials. e.g., ceramics used for capacitors).

The solder 207 that is used to attach the roughened surface 208 to the solid mass 206, by contrast, can react with the liquid coolant. As described in more detail below, the exposed edges of the solder 207 are coated with the inert protective material to prevent chemical reaction with the coolant. The non exposed region of the solder 207 (sandwiched between the roughened surface 208 and the solid mass) maintains low thermal resistance between the roughened surface 208 and the solid mass 206. As such, the low thermal resistance between the semiconductor chip 202 and the coolant is maintained. Note that in the case where the roughened surface 208 is "porous", the porosity does not extend all the way through the roughened surface 208 such that the top surface of the solder 207 is exposed. That is, in various embodiments, there can be holes in the roughened surface 208 so long as the holes are not through-holes.

Liquids for two-phase immersion baths include Fluroinert™ electronic liquids FC-3284 and FC-72 and Novec™ engineering fluids 7000, 7100 and 7200 all from 3M Corporation of Maplewood, Minnesota. The publication "Compatibility of Fluroinert FC-72 With Selected Materials", Aubert, J. H. and Sawyer, P. S., Sandia National Laboratories, February 2006 and published specifications on the Novec 7100 by 3M all indicate that acrylic does not appreciably react with either of these fluids. Likewise, acrylic is not expected to chemically react with immersion coolant fluids other than these specific fluids.

Acrylic also does not appreciably react with the kinds of materials that are exposed by various packaged semiconductor chips (including their cooling assemblies) and electronic circuit boards (e.g., FR4, BT, various epoxies, various sealants, various metals, various solders and fluxes, various plastics, various ceramics, etc.).

Finally, a layer of acrylic can be applied sufficiently thin, e.g., in a range of 25-50 μm.

Another good candidate for similar reasons is an ultraviolet (UV) curable glue ("UV glue"). For ease of discussion the remainder of the document will refer mostly to acrylic as the protective material but it is to be understood that other protective materials (such as UV glue) can also be used.

A challenge, however, is applying the acrylic in a way that ensures coating of just the exposed materials of a board and its components that can react with the coolant. For example, referring back to FIG. 2, the aforementioned exposed edges of the solder 207, which can react with the coolant and therefore should be coated with the acrylic, are "hard to reach" areas 209 because they reside beneath the overhang of the roughened surface 208.

Figure 3A:
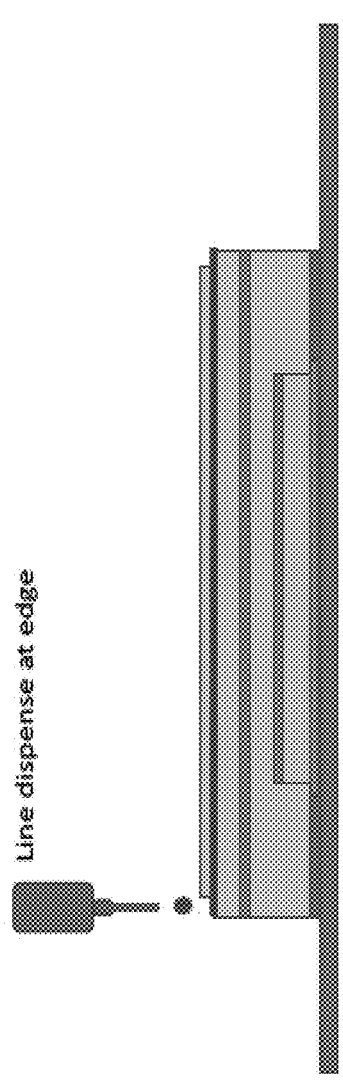
FIGS. 3a and 3b show a technique for selectively forming a protective layer on exposed materials of an electronic circuit board and electronic components disposed on the electronic circuit board.

FIG. 3a therefore shows application of the acrylic in such a hard to reach area with a line dispense approach. Here, the acrylic is in liquid phase and is emitted as a jet of liquid at a target region with high precision. As observed in FIG. 3a, the aforementioned hard to reach solder 207 between the roughened surface 208 and the mass 206 is successfully coated with a line dispense of liquid acrylic. The remainder of the assembly 208/206/205/204 need not be coated with acrylic because their respective materials so not react with the immersion bath coolant.

The approach of FIG. 3a can therefore be applied for any exposed material that reacts with the coolant, and, is particularly useful for materials that are associated with the cooling apparatus of a high power semiconductor chip. Here, acrylic is essentially a thermal insulator (has high thermal resistance) and its application on components that are designed to directly dissipate substantial amounts of heat into the liquid (e.g., the roughened surface 208, the solid mass 206) would be counter productive.

Figure 3B:
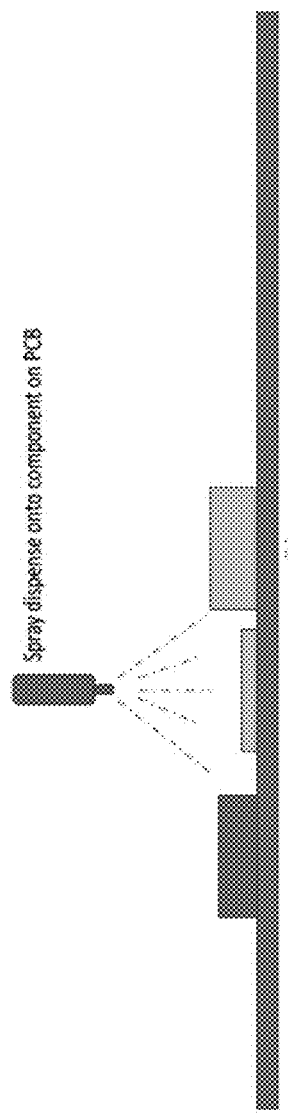

FIG. 3b shows a liquid spray of acrylic having an appreciable cone of emission being used to coat manifestly exposed areas (that are not hard to reach). Wide area conformal coating of a board and its components can be useful, for example, where one or more reactive materials are exposed that are not associated with high performance components that dissipate large amounts of heat. For example, the solder used for passive devices such as resistors and capacitors can also react with the liquid coolant. However, because such passive devices typically do not generate large amounts of heat, they can be conformally coated with the acrylic.

An approach therefore includes, in various embodiments, line dispensing with high precision regions that are hard to reach (e.g., regions that reside beneath an overhanging structure, thin regions, small regions, etc.) and that are near other surface(s) that are designed to transfer large amounts of heat into the coolant. In this case the high precision line dispense only coats the hard to reach area and does not coat the other surface(s). Examples include solders that are used in the mechanical/cooling hardware of high performance semiconductor chips (e.g., solder used in the cooling assembly of a CPU, GPU, memory modules (e.g., dual in-line memory modules (DIMMs), etc.).

The approach can also include spraying larger regions having exposed reactive materials that are not hard to reach and that are not expected to transfer large amounts of heat into the liquid (e.g., a field of electronic board having resistors and capacitors). According to one embodiment, line dispensing is first applied to all reactive areas that are deemed hard to reach and are near other areas that will transfer large amounts of heat into the coolant, then, larger areas that do not transfer large amounts of heat to the coolant and contain a mixture of exposed reactive and exposed not reactive materials are sprayed. Both the line dispensing and the spraying apply a liquid phase acrylic. The liquid acrylic then dries, or is cured, to harden and form a conformal protective layer that prevents the board and its components from coming into contact with immersion bath liquid.

Figure 4:
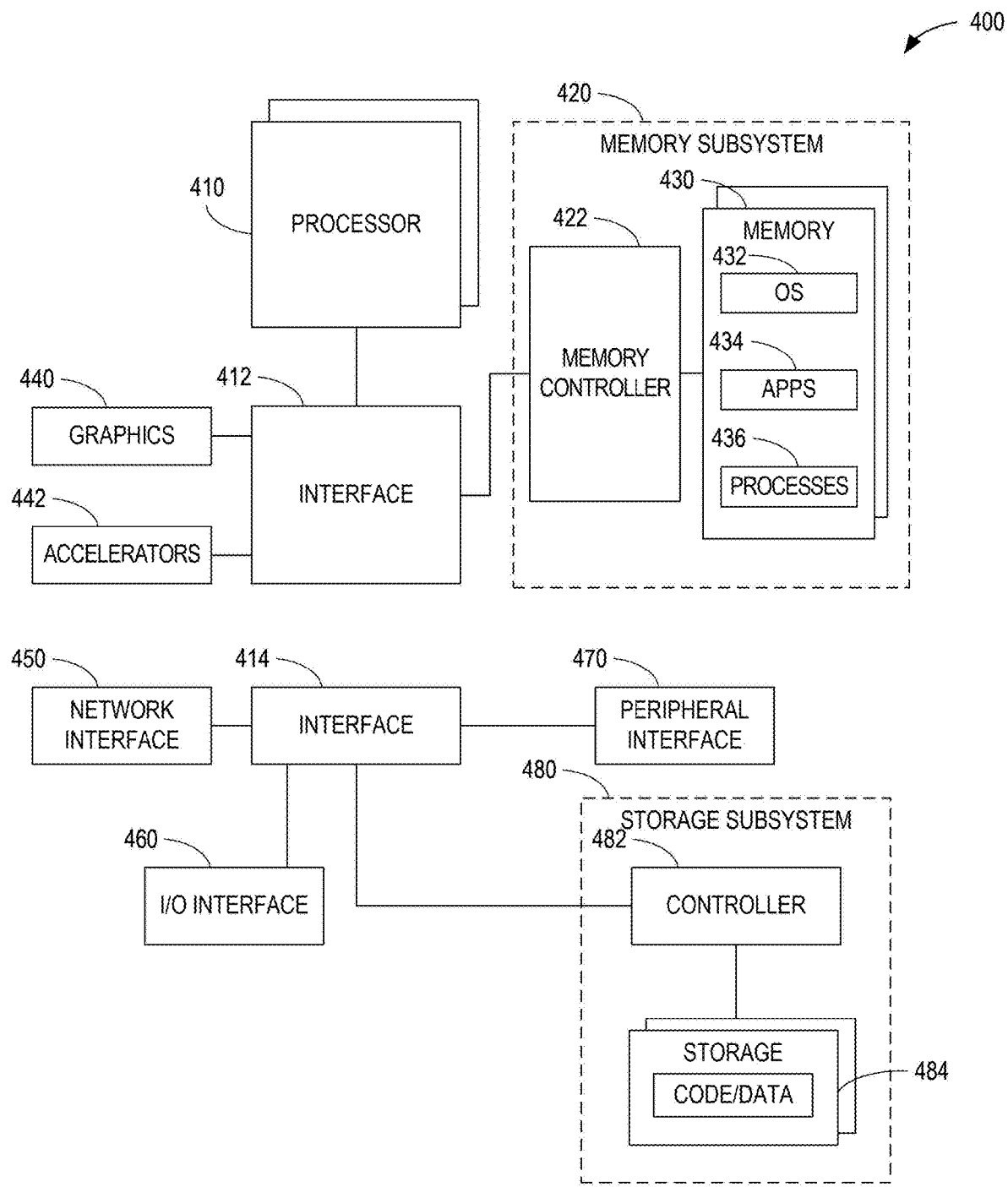
FIG. 4 shows a system.
Figure 5:
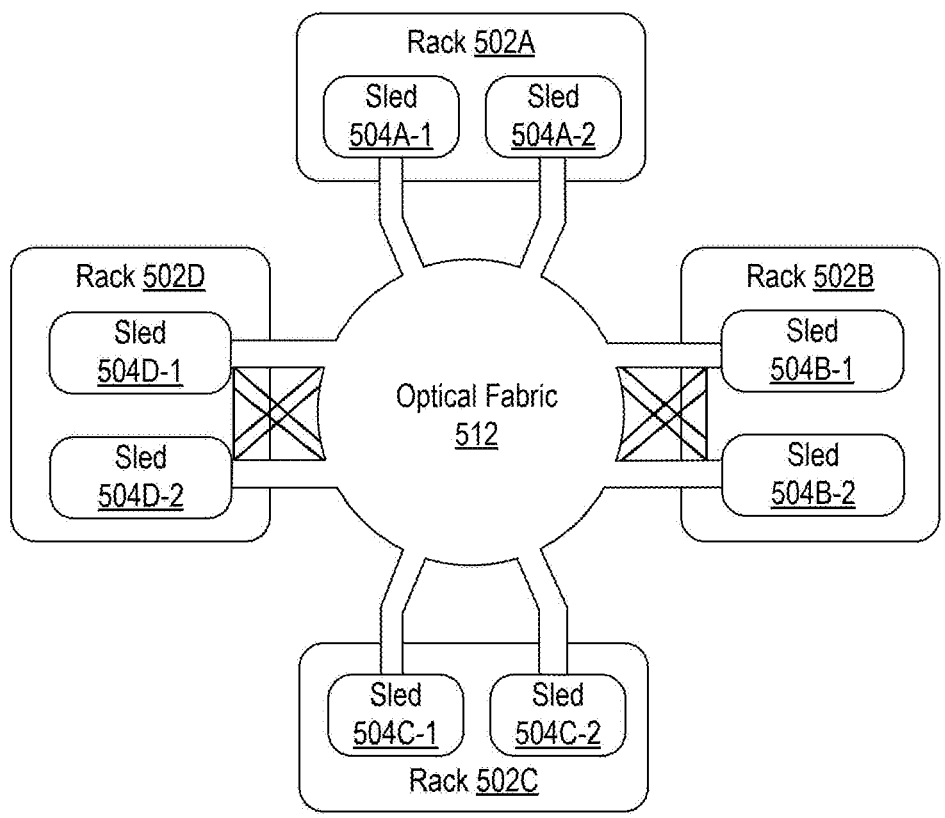
FIG. 5 shows a data center.
Figure 6:
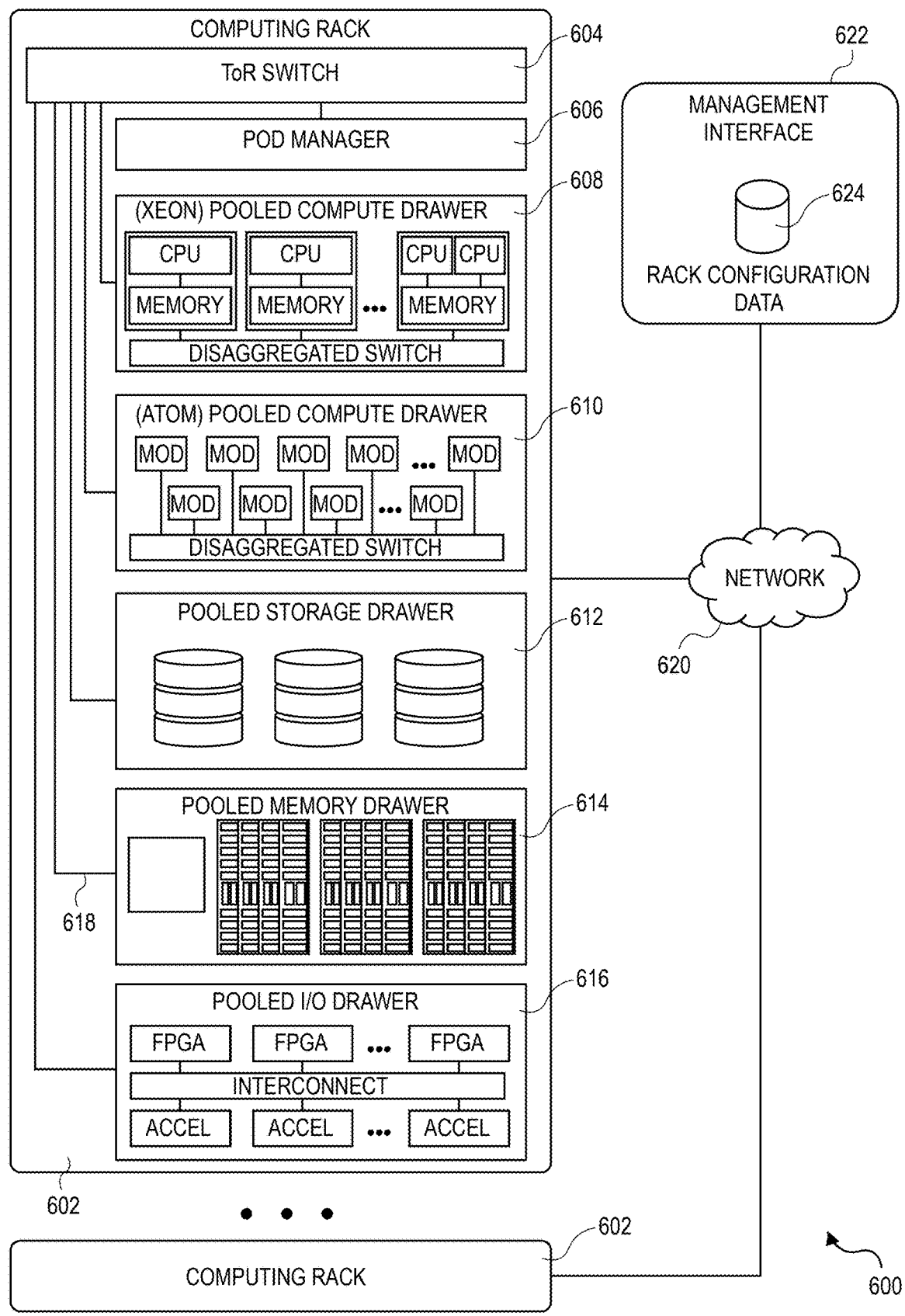
FIG. 6 shows a rack.

The following discussion concerning FIGS. 4, 5 and 6 are directed to systems, data centers and rack implementations, generally. It is pertinent to point out that any electronic component and/or electro-optic component on any electronic circuit board of any of the systems, data centers and rack implementations described below can be cooled with an immersion bath and coated with a protective layer to prevent chemical reaction with the immersion bath according to the teachings discussed at length just above.

FIG. 4 depicts an example system. System 400 includes processor 410, which provides processing, operation management, and execution of instructions for system 400.

Processor 410 can include any type of microprocessor, central processing unit (CPU), graphics processing unit (GPU), processing core, or other processing hardware to provide processing for system 400, or a combination of processors. Processor 410 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 400 includes interface 412 coupled to processor 410, which can represent a higher speed interface or a high throughput interface for system components that needs higher bandwidth connections, such as memory subsystem 420 or graphics interface components 440, or accelerators 442. Interface 412 represents an interface circuit, which can be a standalone component or integrated onto a processor die. Where present, graphics interface 440 interfaces to graphics components for providing a visual display to a user of system 400. In one example, graphics interface 440 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 440 generates a display based on data stored in memory 430 or based on operations executed by processor 410 or both. In one example, graphics interface 440 generates a display based on data stored in memory 430 or based on operations executed by processor 410 or both.

Accelerators 442 can be a fixed function offload engine that can be accessed or used by a processor 410. For example, an accelerator among accelerators 442 can provide compression (DC) capability, cryptography services such as public key encryption (PKE), cipher, hash/authentication capabilities, decryption, or other capabilities or services. In some embodiments, in addition or alternatively, an accelerator among accelerators 442 provides field select controller capabilities as described herein. In some cases, accelerators 442 can be integrated into a CPU socket (e.g., a connector to a motherboard or circuit board that includes a CPU and provides an electrical interface with the CPU). For example, accelerators 442 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 442 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 420 represents the main memory of system 400 and provides storage for code to be executed by processor 410, or data values to be used in executing a routine. Memory subsystem 420 can include one or more memory devices 430 such as read-only memory (ROM), flash memory, volatile memory, or a combination of such devices. Memory 430 stores and hosts, among other things, operating system (OS) 432 to provide a software platform for execution of instructions in system 400. Additionally, applications 434 can execute on the software platform of OS 432 from memory 430. Applications 434 represent programs that have their own operational logic to perform execution of one or more functions. Processes 436 represent agents or routines that provide auxiliary functions to OS 432 or one or more applications 434 or a combination. OS 432, applications 434, and processes 436 provide software logic to provide functions for system 400. In one example, memory subsystem 420 includes memory controller 422, which is a memory controller to generate and issue commands to memory 430. It will be understood that memory controller 422 could be a physical part of processor 410 or a physical part of interface 412. For example, memory controller 422 can be an integrated memory controller, integrated onto a circuit with processor 410. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 400 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 400 includes interface 414, which can be coupled to interface 412. In one example, interface 414 represents an interface circuit, which can include standalone components and integrated circuitry. In one example, multiple user interface components or peripheral components, or both, couple to interface 414. Network interface 450 provides system 400 the ability to communicate with remote devices (e.g., servers or other computing devices) over one or more networks. Network interface 450 can include an Ethernet adapter, wireless interconnection components, cellular network interconnection components, USB (universal serial bus), or other wired or wireless standards-based or proprietary interfaces. Network interface 450 can transmit data to a remote device, which can include sending data stored in memory. Network interface 450 can receive data from a remote device, which can include storing received data into memory. Various embodiments can be used in connection with network interface 450, processor 410, and memory subsystem 420.

In one example, system 400 includes one or more input/output (I/O) interface(s) 460. I/O interface 460 can include one or more interface components through which a user interacts with system 400 (e.g., audio, alphanumeric, tactile/touch, or other interfacing). Peripheral interface 470 can include any hardware interface not specifically mentioned above. Peripherals refer generally to devices that connect dependently to system 400. A dependent connection is one where system 400 provides the software platform or hardware platform or both on which operation executes, and with which a user interacts.

In one example, system 400 includes storage subsystem 480 to store data in a nonvolatile manner. In one example, in certain system implementations, at least certain components of storage 480 can overlap with components of memory subsystem 420. Storage subsystem 480 includes storage device(s) 484, which can be or include any conventional medium for storing large amounts of data in a non-volatile manner, such as one or more magnetic, solid state, or optical based disks, or a combination. Storage 484 holds code or instructions and data in a persistent state (e.g., the value is retained despite interruption of power to system 400). Storage 484 can be generically considered to be a "memory," although memory 430 is typically the executing or operating memory to provide instructions to processor 410. Whereas storage 484 is nonvolatile, memory 430 can include volatile memory (e.g., the value or state of the data is indeterminate if power is interrupted to system 400). In one example, storage subsystem 480 includes controller 482 to interface with storage 484. In one example controller 482 is a physical part of interface 414 or processor 410 or can include circuits or logic in both processor 410 and interface 414.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-M RAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 400. More specifically, power source typically interfaces to one or multiple power supplies in system 400 to provide power to the components of system 400. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 400 can be implemented as a disaggregated computing system. For example, the system 400 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 5 depicts an example of a data center. Various embodiments can be used in or with the data center of FIG. 5. As shown in FIG. 5, data center 500 may include an optical fabric 512. Optical fabric 512 may generally include a combination of optical signaling media (such as optical cabling) and optical switching infrastructure via which any particular sled in data center 500 can send signals to (and receive signals from) the other sleds in data center 500. However, optical, wireless, and/or electrical signals can be transmitted using fabric 512. The signaling connectivity that optical fabric 512 provides to any given sled may include connectivity both to other sleds in a same rack and sleds in other racks.

Data center 500 includes four racks 502A to 502D that house respective pairs of sleds 504A-1 and 504A-2, 504B-1 and 504B-2, 504C-1 and 504C-2, and 504D-1 and 504D-2. Thus, in this example, data center 500 includes a total of eight sleds. Optical fabric 512 can provide sled signaling connectivity with one or more of the seven other sleds. For example, via optical fabric 512, sled 504A-1 in rack 502A may possess signaling connectivity with sled 504A-2 in rack 502A, as well as the six other sleds 504B-1, 504B-2, 504C-1, 504C-2, 504D-1, and 504D-2 that are distributed among the other racks 502B, 502C, and 502D of data center 500. The embodiments are not limited to this example. For example, fabric 512 can provide optical and/or electrical signaling.

FIG. 6 depicts an environment 600 that includes multiple computing racks 602, each including a Top of Rack (ToR) switch 604, a pod manager 606, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 608, and INTEL® ATOM™ pooled compute drawer 610, a pooled storage drawer 612, a pooled memory drawer 614, and a pooled I/O drawer 616. Each of the pooled system drawers is connected to ToR switch 604 via a high-speed link 618, such as a 40 Gigabit/second (Gb/s) or 100 Gb/s Ethernet link or an 100+ Gb/s Silicon Photonics (SiPh) optical link. In one embodiment high-speed link 618 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 602 may be interconnected via their ToR switches 604 (e.g., to a pod-level switch or data center switch), as illustrated by connections to a network 620. In some embodiments, groups of computing racks 602 are managed as separate pods via pod manager(s) 606. In one embodiment, a single pod manager is used to manage all of the racks in the pod. Alternatively, distributed pod managers may be used for pod management operations. RSD environment 600 further includes a management interface 622 that is used to manage various aspects of the RSD environment. This includes managing rack configuration, with corresponding parameters stored as rack configuration data 624.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
an electronic circuit board comprising electronic components thereon, a protective material coated on an exposed material of the electronic circuit board and the electronic components, the protective material being chemically inert with the exposed material, the protective material being chemically inert with an immersion bath cooling liquid that the electronic circuit board and electronic components are to be immersed within, wherein, a thermal cooling structure of one of the electronic components that is designed to transfer heat into the immersion bath cooling liquid is not coated with the protective material.

2. The apparatus of claim 1 wherein the protective material comprises acrylic.

3. The apparatus of claim 1 wherein the protective material comprises an ultraviolet (UV) glue.

4. The apparatus of claim 1 wherein the protective material has a thickness in a range of 25-50 um inclusive.

5. The apparatus of claim 1 wherein the protective material is coated on a region of the exposed material that resides beneath an over-hanging structure.

6. The apparatus of claim 1 wherein the thermal cooling structure comprises a roughened surface on a mass, the mass in thermal contact with an integrated heat spreader of a semiconductor chip package.

7. A data center, comprising:
one or more networks;
a plurality of computing systems that are communicatively coupled by the one or more networks;
an immersion bath of liquid coolant; and,
an electronic circuit board of one of the plurality of computing systems immersed in the immersion bath of liquid coolant, the electronic circuit board comprising electronic components thereon, a protective material coated on an exposed material of the electronic circuit board and the electronic components, the protective material being chemically inert with the exposed material, the protective material being chemically inert with the liquid coolant, wherein, a thermal cooling structure of one of the electronic components that is designed to transfer heat into the immersion bath of the liquid coolant is not coated with the protective material.

8. The data center of claim 7 wherein the protective material comprises acrylic.

9. The data center of claim 7 wherein the protective material comprises an ultraviolet (UV) glue.

10. The data center of claim 7 wherein the protective material has a thickness of in a range of 2550 um inclusive.

11. The data center of claim 7 wherein the protective material is coated on a region of the exposed material that resides beneath an over-hanging structure.

12. The data center of claim 7 wherein the thermal cooling structure comprises a roughened surface on a mass, the mass in thermal contact with an integrated heat spreader of a semiconductor chip package.

13. A method, comprising:
operating electronic components disposed on an electronic circuit board, the electronic circuit board immersed in a liquid coolant bath;

cooling the electronic components, the cooling of the electronic components comprising i) through iv) below:
  i) transferring heat from a semiconductor chip to an integrated heat spreader of a semiconductor chip's package;
  ii) transferring heat from the integrated heat spreader to a mass that is disposed on the integrated heat spreader;
  iii) transferring heat from the mass to a roughened surface on the mass through a solder whose exposed edges are coated with a protective material that is chemically inert with the solder and the liquid coolant bath;
  iv) transferring heat from the roughened surface on the mass to the liquid coolant bath.

14. The method of claim 13 wherein the protective material comprises acrylic.

15. The method of claim 13 wherein the protective material comprises an ultraviolet (UV) glue.

16. The method of claim 13 wherein the protective material has a thickness of in a range of 25-50 um typically.

17. The method of claim 13 wherein the exposed edges reside beneath an over-hanging structure of the roughened surface.

18. The method of claim 13 wherein the mass and the roughened surface are not coated with the protective material.

* * * * *